(12) United States Patent
Wang

(10) Patent No.: US 9,685,239 B1
(45) Date of Patent: Jun. 20, 2017

(54) FIELD SUB-BITLINE NOR FLASH ARRAY

(71) Applicant: PEGASUS SEMICONDUCTOR (BEIJING) CO.,LTD, Beijing (CN)

(72) Inventor: Lee Wang, Beijing (CN)

(73) Assignee: PEGASUS SEMICONDUCTOR (BEIJING) CO., LTD, Dongcheng District, Beijing (CN)

( * ) Notice: Subject to any disclaimer, the term of this patent is extended or adjusted under 35 U.S.C. 154(b) by 0 days.

(21) Appl. No.: 15/291,932

(22) Filed: Oct. 12, 2016

(51) Int. Cl.
| | | |
|---|---|---|
| *G11C 16/04* | (2006.01) | |
| *G11C 16/34* | (2006.01) | |
| *G11C 16/14* | (2006.01) | |
| *G11C 16/26* | (2006.01) | |
| *G11C 16/10* | (2006.01) | |
| *H01L 27/11524* | (2017.01) | |
| *H01L 27/11556* | (2017.01) | |
| *H01L 27/11529* | (2017.01) | |
| *H01L 27/1157* | (2017.01) | |
| *H01L 27/11582* | (2017.01) | |
| *H01L 27/11573* | (2017.01) | |
| *H01L 23/522* | (2006.01) | |

(Continued)

(52) U.S. Cl.
CPC ...... *G11C 16/3427* (2013.01); *G11C 16/0466* (2013.01); *G11C 16/0483* (2013.01); *G11C 16/10* (2013.01); *G11C 16/14* (2013.01); *G11C 16/26* (2013.01); *H01L 23/528* (2013.01); *H01L 23/5226* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 27/11582* (2013.01); *H01L 29/408* (2013.01)

(58) Field of Classification Search
CPC ............ G11C 16/0441; G11C 16/0466; G11C 16/0483; G11C 16/10; G11C 16/04; G11C 16/14; G11C 16/26
USPC ............ 365/185.02, 185.03, 185.05, 185.17, 365/185.18, 185.25
See application file for complete search history.

(56) References Cited

U.S. PATENT DOCUMENTS

| | | | |
|---|---|---|---|
| 6,005,810 A * | 12/1999 | Wu ...................... | G11C 16/3418 365/185.08 |
| 6,856,546 B2 * | 2/2005 | Guterman ........... | G11C 11/5621 257/E27.103 |
| 7,733,700 B2 | 6/2010 | Wang | |

(Continued)

*Primary Examiner* — Gene Auduong
(74) *Attorney, Agent, or Firm* — Muncy, Geissler, Olds & Lowe, P.C.

(57) ABSTRACT

A Field Sub-bitline NOR-type (FSNOR) flash array and its operating methods are disclosed. In contrast to the conventional NOR flash array, the FSNOR array is configured in column with multiple 90° rotated NOR pairs linked by field side sub-bitlines to achieve the minimum $4F^2$ cell size. The FSNOR flash array is divided into multiple sectors by selection transistors for connecting the even/odd sub-bitlines to the global main first metal bitlines. For each FSNOR sector, the two drain electrodes of column-adjacent NOR pairs form the even/odd sub-bitlines separated by trench field oxides respectively, and the common source electrodes of NOR pairs in a column form the common diffusion source lines tied with metal contacts connected to the first metal common source lines. The FSNOR flash array design has enhanced the electrical isolation of the selected NVM cell devices from the unselected NVM cell devices.

17 Claims, 11 Drawing Sheets

(51) Int. Cl.
*H01L 23/528* (2006.01)
*H01L 29/40* (2006.01)

(56) References Cited

U.S. PATENT DOCUMENTS

| | | |
|---|---|---|
| 8,415,721 B2 | 4/2013 | Wang |
| 8,716,138 B2 | 5/2014 | Wang |
| 8,917,551 B2 * | 12/2014 | Lee .................... G11C 16/0441 365/185.03 |
| 9,019,964 B2 * | 4/2015 | Chen ..................... H04L 41/042 370/389 |
| 9,082,490 B2 | 7/2015 | Wang |
| 2003/0052360 A1 * | 3/2003 | Guterman .......... G11C 16/0425 257/315 |
| 2005/0127428 A1 * | 6/2005 | Mokhlesi ............. H01L 27/115 257/315 |

* cited by examiner

FIELD SUB-BITLINE NOR FLASH ARRAY

BACKGROUND OF THE INVENTION

Field of the Invention

This invention relates to array architecture of Non-Volatile Memory (NVM) semiconductor cell devices. In particular, the innovative Field Sub-bitline NOR (FSNOR) flash array is configured with multiple NVM semiconductor cell devices, where the drain electrodes of multiple NVM cell pairs in a column are connected together to form two field side sub-bitlines and the common source electrodes of the multiple NVM cell pairs in the column are connected to form a single common source line, and the control gates of multiple NVM cell pairs in rows form the wordlines.

Description of the Related Art

Non-Volatile Memory (NVM) semiconductor, and particularly Electrically Erasable, Programmable Read-Only Memories (EEPROM), exhibit wide spread applicability in a range of electronic equipment from computers, to telecommunication hardware, to consumer appliances. In general, EEPROM serves a niche in the NVM space as a mechanism for storing firmware and data that can be kept even with power off and can be altered as needed.

Non-volatile data represented by the states of threshold voltages (devices' on/off voltages) is stored in EEPROM devices by modulating devices' threshold voltages through the injection of charge carriers into the charge-storage layer of EEPROM devices. For example, with respect to an N-channel EEPROM device, an accumulation of electrons in the floating gate, or in a charge storage dielectric layer, or in a layer of embedded nano-crystals above the channel region, causes the device to exhibit a relatively high threshold voltage.

Flash EEPROM may be regarded as specifically configured EEPROM devices into cell array that may be erased only on a global or sector-by-sector basis. Flash EEPROM arrays are also categorized into NOR flash and NAND flash according to the configurations of memory cell connections in the flash arrays. The conventional NOR flash array connects cell devices in parallel-connected pairs 10 in FIG. 1, where rows of common source electrodes of the paired cell devices 10 are connected to form multiple horizontal common source lines CS and columns of drain electrodes of the paired cell devices 10 are connected to form multiple vertical bitlines, respectively. As the cell device schematic for an "M×N" NOR flash array shown in FIG. 1, each wordline running in x-direction contains "M" NVM cells with the drain electrodes 12 of the NOR cell pairs 10 vertically connected to form bitlines $B_i$ for i=1, ... M, and each bitline running in y-direction is attached with "N" drain electrodes of the NVM cells. The common source electrodes 11 of rows of NOR cell pairs 10 in the array are horizontally connected to form the common source lines CS. When a wordline is selected, the entire "M" NVM cells of the selected wordline are activated. On the other hand, the NVM cells of the unselected wordlines in the array are electrically detached from the "M" bitlines. The electrical responses at the drain electrodes of the selected "M" NVM cells can be detected through their attached "M" bitlines. Since the applied electrical biases and NVM signals are directly in contact with the drain electrodes of the selected NVM cells in NOR-type flash array without passing any other NMV devices, the read and write access speed are faster and the operation voltages are lower for NOR-type flash array in comparison with NAND-type flash array.

The NAND-type flash array connects the NVM cells in series. Unlike the NOR type array with the configuration of source electrode-to-source electrode connection and drain electrode-to-drain electrode connection, NAND-type flash array link the drain electrode of an NVM cell to the source electrode of its next neighboring cell. Usually, the numbers of NVM cells linked in one single NAND string 20 in FIG. 2 are from 8 cells to 128 cells depending on the generations of the process technology nodes. In FIG. 2, the schematic for an "M×N" NAND flash array, the array contains "q*M" NAND cell strings 20 and each NAND cell string 20 contains "p" NVM cells (p=8~128) and one selection gate to connect the string to the main bitline. Each bitline has "q" NAND cell strings 20 attached. Thus the total NVM cells attached to a single main bitline is p*q=N for an "M×N" NAND array. Since the source electrode and the drain electrode of NVM cells are overlapped each other in the NAND cell string, the NVM cells have no contacts in between the linked NVM cells except one contact 21 placed at the end of the cell string for connecting the NAND string to the main bitline. Usually, a single main bitline connects several NAND strings 20 in y-direction and common source lines CS run in x-direction in the NAND flash array. In contrast, each pair of NVM cells in NOR-type array does have one contact 11 for connecting the cell's two drain electrodes (one drain electrode equivalently sharing a half contact) to the main bitline. A NOR-type flash array is equivalently to a NAND-type array with p=1. Typically, the NOR-type NVM cell sizes including the area for a single contact 11 in a NOR flash array are 9~10 $F^2$ and the NAND-type NVM cell sizes without a contact area in a NAND flash array can achieve the minimum cell area of 4 $F^2$ respectively, where F is minimum feature size for a process technology node. Therefore, the chip areas of NAND type flash arrays are smaller than those of the NOR type flash arrays (~40% to ~50% smaller) for the same memory bits with the same process technology node. In term, the smaller cell array areas for NAND flash would have the advantage of lower manufacturing cost for the same bit storage capacity.

Making NOR flash array to be cost competitive as NAND flash array for the same $4F^2$ memory cell sizes, we disclosed the NOR flash array using the NVM cell semiconductor devices fabricated with the conventional flash process technology in U.S. Pat. Nos. 8,415,721 B2 and 8,716,138 B2 (the disclosure of which are incorporated herein by reference in their entirety). In the disclosures as shown in FIG. 3, the NOR cell pairs 30 of NVM semiconductor devices in FIG. 3 are arranged by rotating 90° of the conventional NOR cell pairs 10 shown in FIG. 1. The drain and source electrodes of the NOR cell pairs 30 form the diffusion sub-bitlines 31 separated by trench field isolation. By twisting the diffusion sub-bitlines along the trench field isolation by a fractional pitch, the diffusion sub-bitlines are able to link their sub-feature diffusion lines (whose features are smaller than the minimum feature F) to the full feature diffusion areas, where full-feature contacts 32 can be landed on. Through the contacts 32 attached to the main bitlines $B_i$ for i=1, ..., M, in FIG. 3, the electrical signals can be picked up from the selected NVM cell devices and the voltage biases can be applied to drain electrodes of the selected NVM cell devices without passing any other NVM cell devices as the NAND flash. For the FSNOR flash array 300 in FIG. 3, multiple rows (said 8~128 rows) of NOR cell pairs 30 are connected with diffusion sub-bitlines to form a NOR flash sector 300s. The main metal bitlines globally connect multiple sectors through the multiple contacts 32 to form a bank of NOR flash array 300. Since the extension of multiple sectors in a bank increases the bitline (multiple sub-bitlines+main bitline), capacitance C and resistance R, the electrical signals and voltage biases passing through the bitline to the drain electrodes of the selected NVM devices would be slow and degraded due to the large bitline RC time delay and IR (current-resistance) drops, respectively. Furthermore, the excessive numbers of the unselected NVM devices forming the multiple sector sub-bitlines attached to the single main bitline also increase the bitline leakage currents, i. e., the numbers of unselected cell devices attached to the main bitline multiplied by cell's junction/channel-diffusion leakage current, resulting in high bitline leakage current noise levels for read operation, and significant applied drain voltage bias drops to the drain electrodes of the selected NVM cell devices in programming operation. For those reasons, the numbers of multiple sectors extended in a bank has to be capped for minimum signal/noise ratio and the applying drain voltage bias integrity.

In order to be extendable for the numbers of sectors attached to the single main metal bitlines in a bank, not limited by the above reasons, and reduce the line resistance from the larger resistance of sub-bitlines to the smaller resistance of common source lines, we has disclosed a new type of $4F^2$ FSNOR flash array separated by sectors with the even/odd sub-bitline selections to the global main bitlines for the even/odd number NVM cell devices of the NVM cell pairs and the low resistance global common source lines. In the new FSNOR array architecture of the invention, one and only one selected NVM device is electrically connected to the single global main metal bitline for the accessing operations of read and programming such that the selected NVM cell devices are fully immune from the interferences of other unselected NVM cell devices in the array. This interference immunity for the new FSNOR flash array of the invention is proven to be much better performance on NVM signal/noise ratio, applying drain voltage bias integrity, and programming disturbance to the neighboring cells than any other existing flash arrays.

SUMMARY OF THE INVENTION

FIG. 4 shows the schematic of the "i" sector 400i in new $4F^2$ FSNOR flash array 400 according to an embodiment of the invention. For the sector "i" 400i in the flash array 400, the control gates of NVM cells form wordlines $W_j$, for j=1, . . . , I, in the x-direction with the minimum control gate pitch of a specific process technology and the first metal bitlines in the y-direction with the minimum first metal line pitch of a specific process technology form the global main first metal bitlines and the global first metal common source lines in the alternating common-source-line/bitline sequence of ---, CS, $B_{n-2}$, CS, $B_{n-1}$, CS, $B_n$, CS, $B_{n+1}$, CS, $B_{n+2}$, CS, ---. The odd field side sub-bitlines 41 formed by the drain electrodes of the odd number NVM devices of the columned NVM cell pairs 40 are connected to the source electrodes of the selection MOSFET devices 46 controlled by the odd selection line $S_{io}$ (top) and the even field side sub-bitlines 42 formed by the drain electrodes of the even number NVM devices of the columned NVM cell pairs 40 are connected to the source electrodes of the selection MOSFET devices 48 controlled by the even selection line $S_{ie}$ (bottom). The drain electrodes of the selection MOSFET devices 46 and 48 landed with the contacts 45 are connected to the global main first metal bitlines $B_k$, for k=1, . . . , n, . . . , M, where M is the number of NVM cell pairs 40 in a row. The common source electrodes of the columned NVM cell pairs 40 forms the vertical diffusion common source lines 43, which are tied with the contacts 47 connected to the global first metal common source lines CS. Please note that the NVM cells in each sector comprise no electrical contact inside the sector array area. For example, the NVM cells in sector "i" 400i comprise no electrical contact inside the sector array area (represented by dashed rectangle 400i).

To access the odd number NVM cell devices of a selected wordline (the control gates of a row of NVM devices) in the selected sector "i" for reading and programming, the odd selection line $S_{io}$ is applied with the "on" voltage bias $V_s$ to electrically connect the odd field side sub-bitlines 41 with the global main metal bitlines, while the control gate voltages $V_{CG}$ is applied to activate the selected wordline. For accessing the even number NVM cell devices of a selected wordline in the selected sector "i" 400i, the even selection line $S_{ie}$ is applied with the "on" voltage bias $V_s$ to electrically connect the even field side sub-bitlines 42 with the global main metal bitlines, while the control gate voltage $V_{CG}$ is applied to activate the selected wordline. The charge storing material of NVM devices of the invention is made of conducting floating gate, charge storage dielectric film or a layer of embedded nano-crystal grains.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

For a better understanding of the present invention and to show how it may be carried into effect, reference will now be made to the following drawings, which show the preferred embodiments of the present invention, in which.

DETAILED DESCRIPTION OF THE INVENTION

The Field Sub-bitline NOR (FSNOR) flash arrays of the invention have the same cell array area as those in the NAND-type flash for a specific technology nodes, while preserving the advantages of read/write accessing speed and low operation voltages. Those of ordinary skill in the art will immediately realize that the embodiments of the present invention described herein in the context of schematics and fabrication methods are illustrative only and are not intended to be in any way limiting. Other embodiments of the present invention will readily suggest themselves to such skilled persons having the benefits of this disclosure.

For illustration purpose, we shall apply N-type NVM cells to demonstrate the new FSNOR flash arrays of the invention. However, the FSNOR flash array architectures of the invention are not limited to N-type NVM cells, but are applicable to P-type NVM cells. The NVM cell size in the array demonstrated is determined by Control-Gate pitch and First-Metal line pitch according to a process technology node. The minimum feature size of a process technology node is defined by F. The Control-Gate pitch and First-Metal line pitch can be the minimum 2F for a specific technology node. Thus, the cell feature size for a FSNOR flash array can be the minimum $4F^2$ in contrast to conventional NOR cell feature sizes between $9\sim10F^2$.

Figure 1:
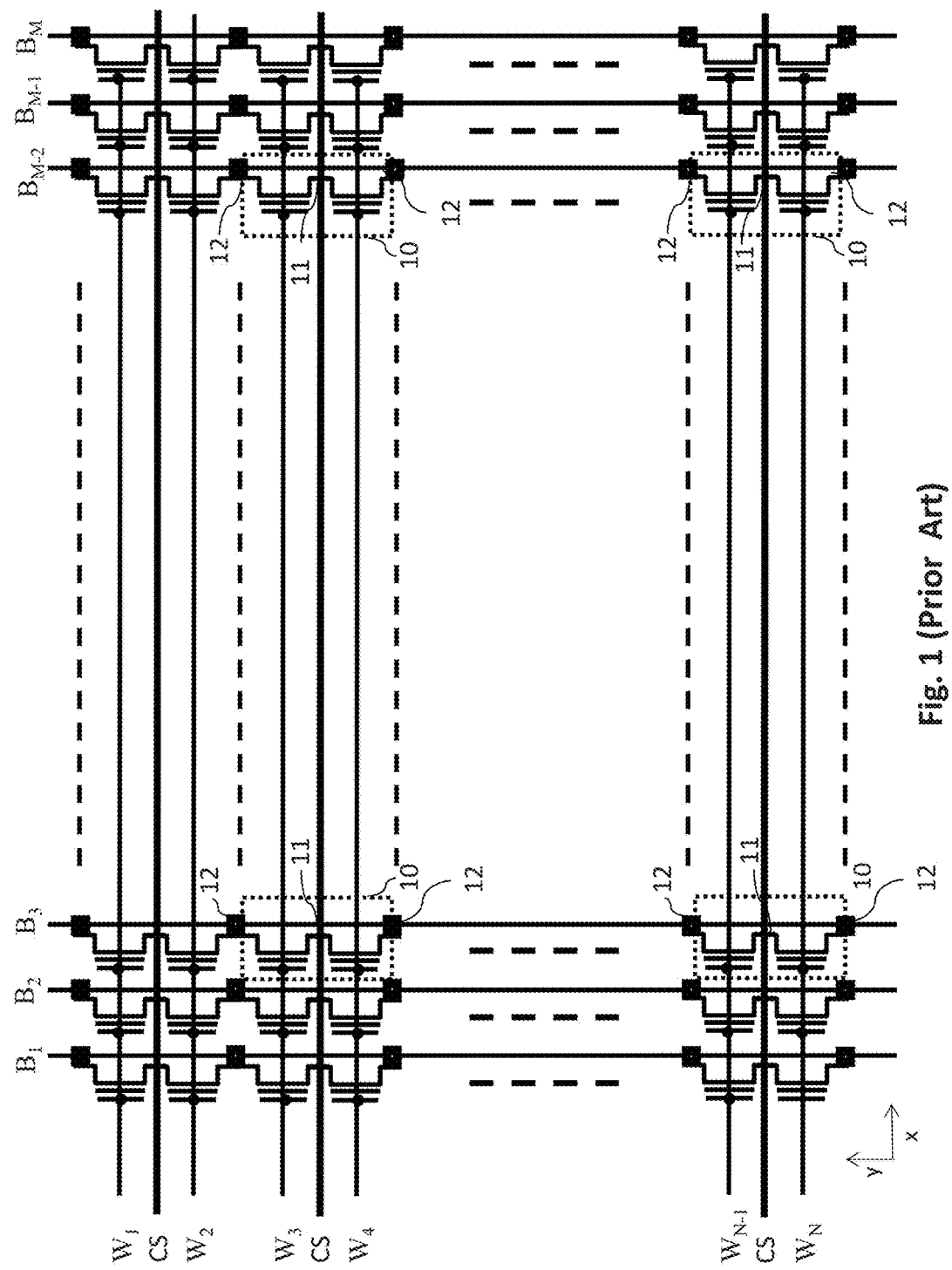
FIG. 1 shows a typical schematic for a conventional NOR-type flash array.
Figure 2:
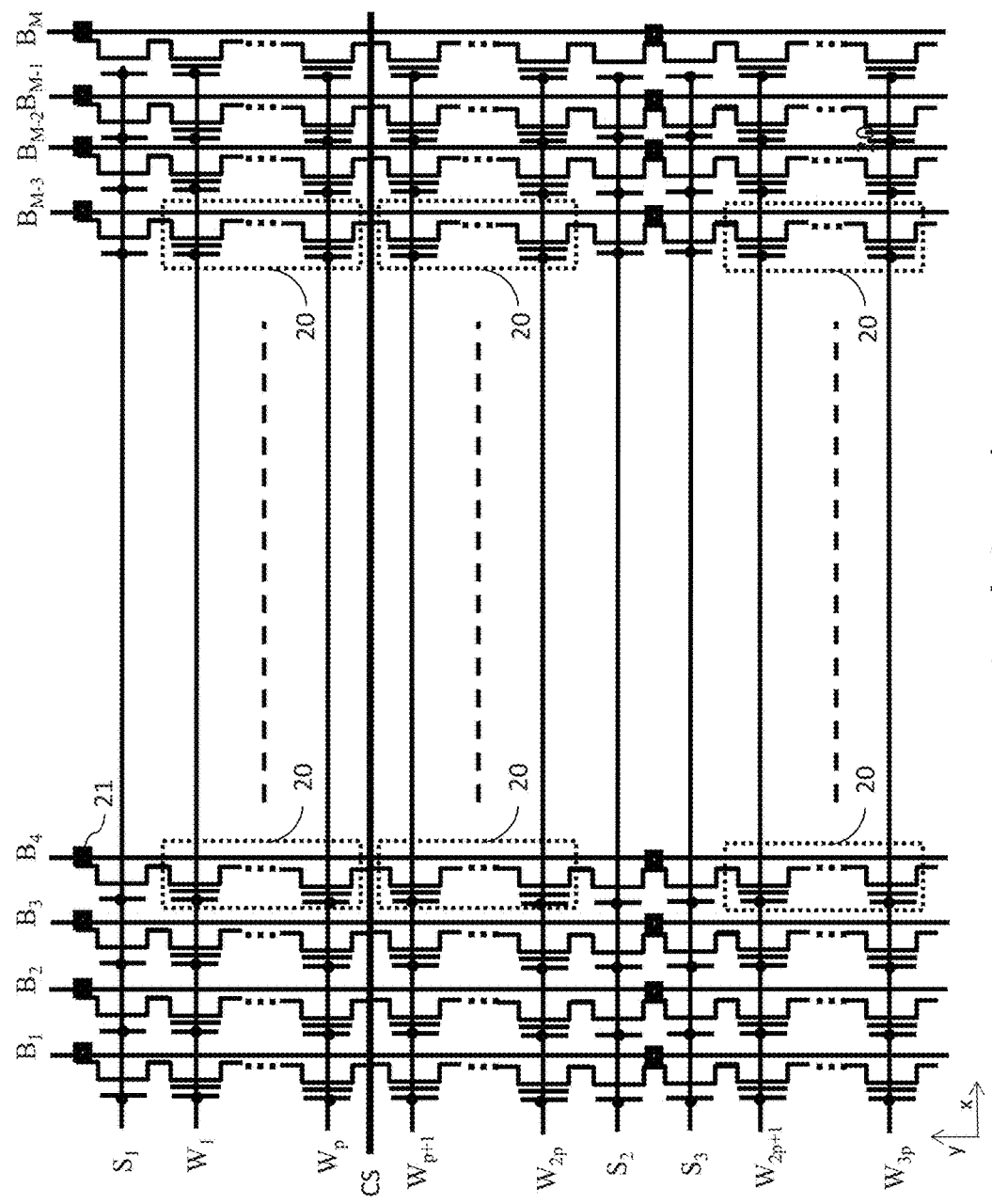
FIG. 2 shows a typical schematic for a conventional NAND type flash array.
Figure 3:
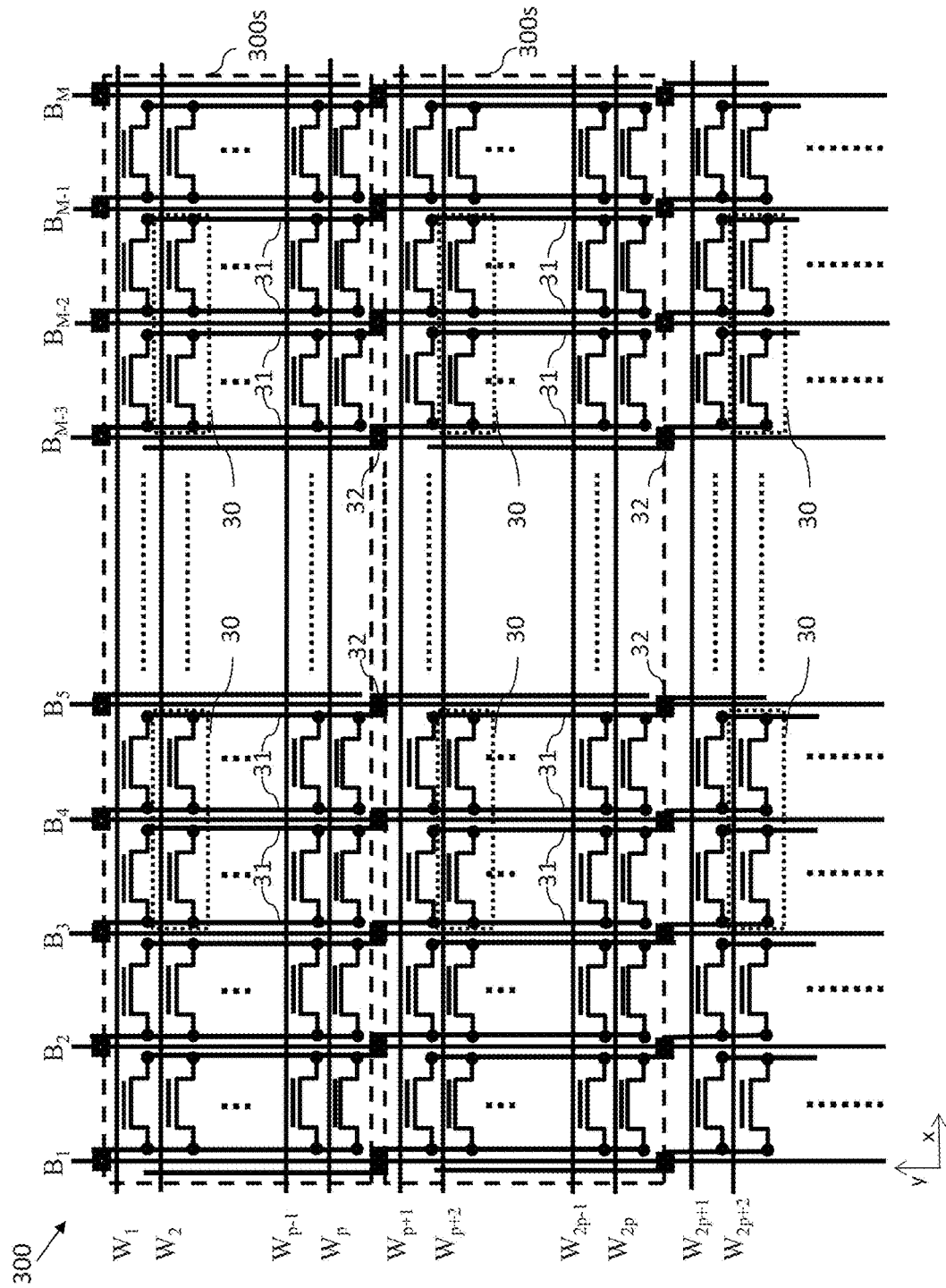
FIG. 3 shows the schematic of FSNOR flash array according to the prior art.
Figure 4:
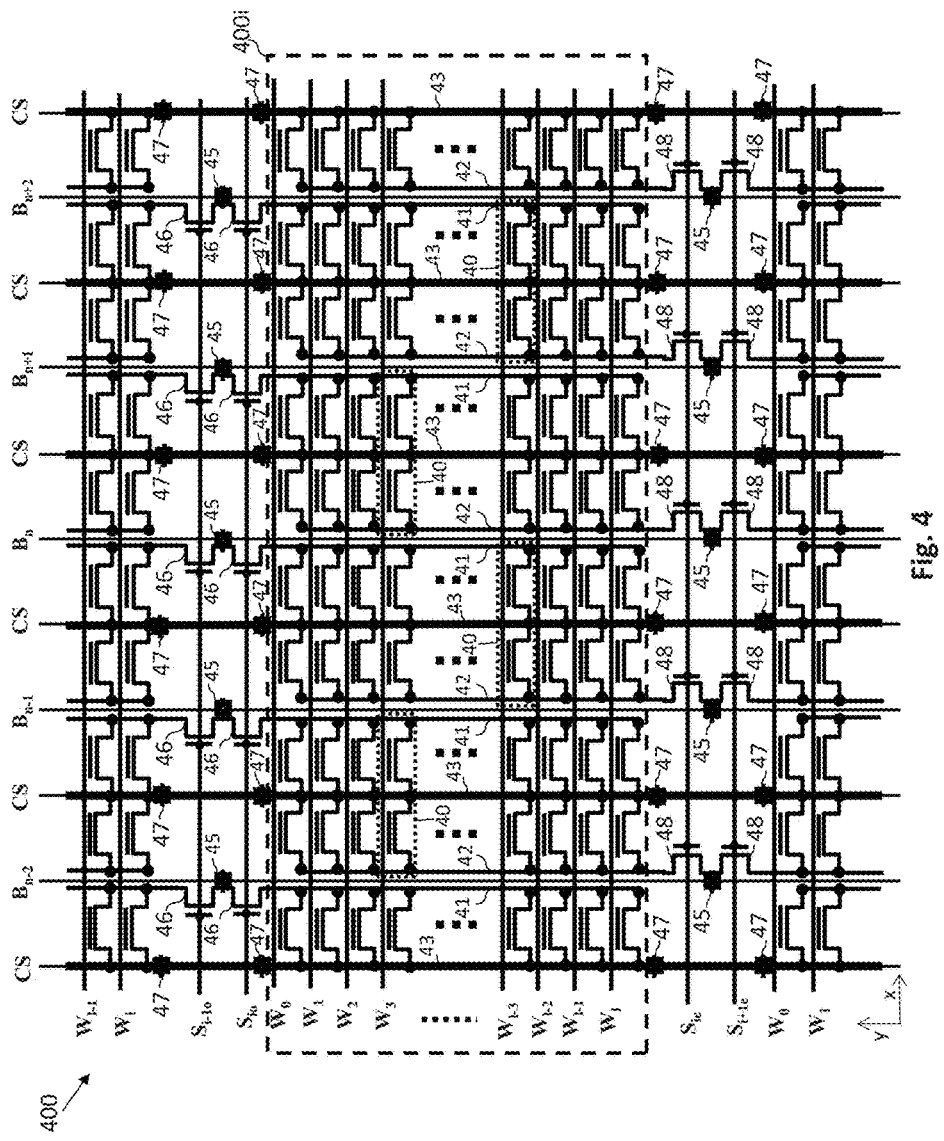
FIG. 4 shows the schematic of FSNOR flash array according to an embodiment of the present invention.
Figure 5:
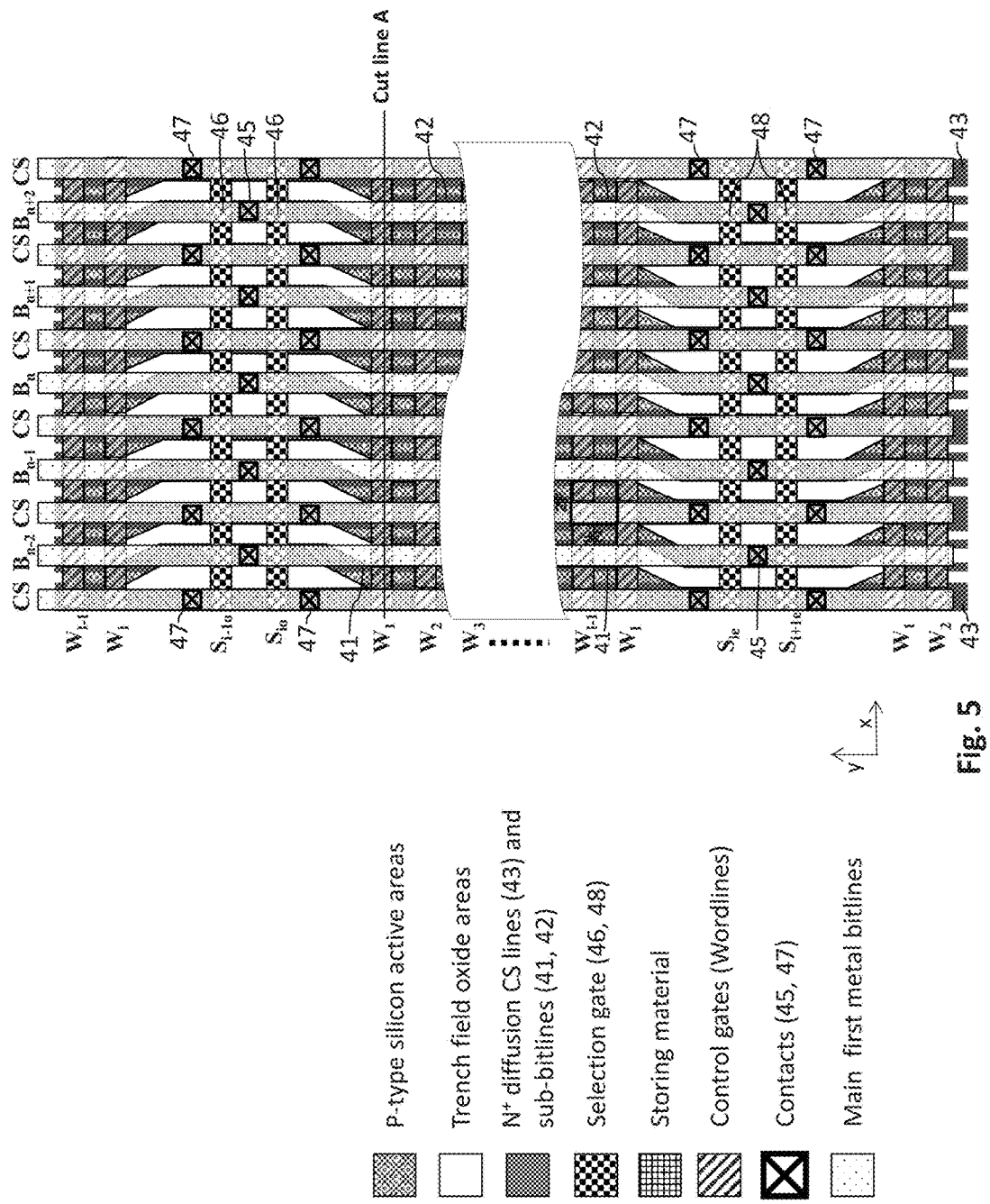
FIG. 5 shows a top view of a portion of the FSNOR flash array of FIG. 4.
Figure 6:
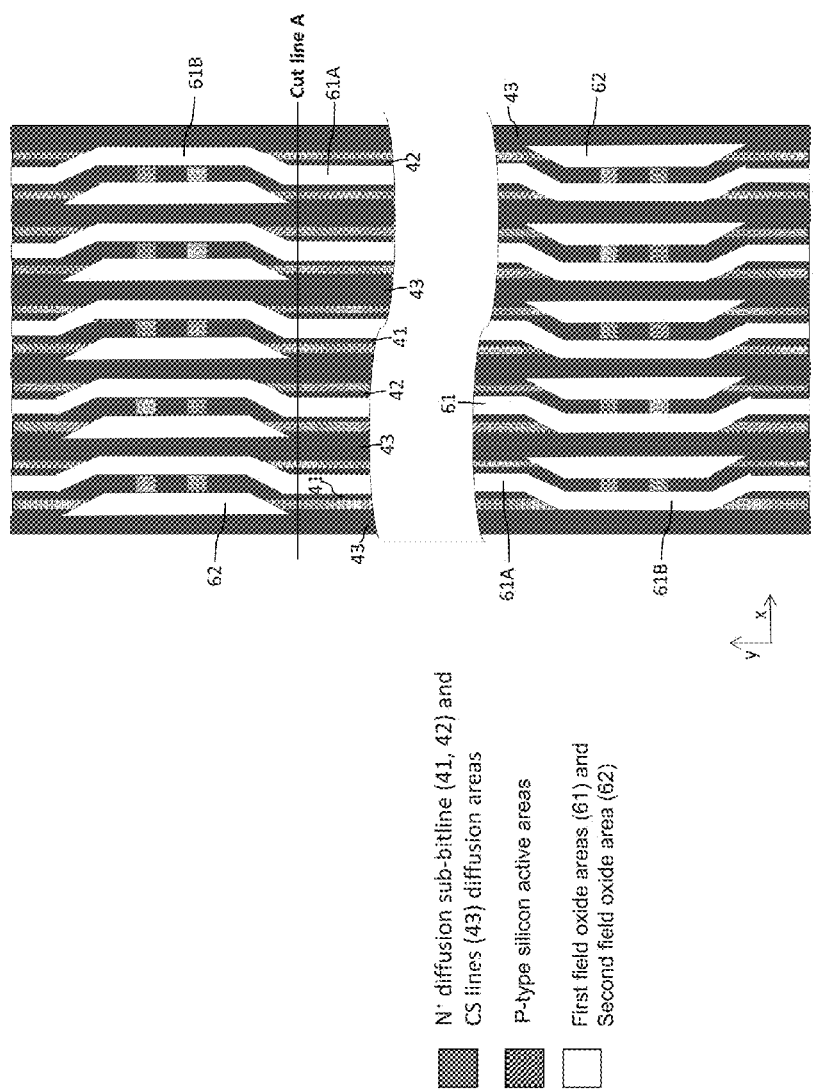
FIG. 6 shows the top view of the silicon surfaces containing P-type silicon active areas, N+sub-bitline (41 and 42) and CS line (43) diffusion areas, and the field oxide areas for the FSNOR flash array according to the invention.

The array top view for the sector schematic in FIG. 4 on silicon is shown in FIG. 5 for the N-type sub-bitline NVM devices. The FSNOR flash arrays 400 of the present invention are fabricated with the conventional CMOS process technology. Examples of the process module for forming the field side sub-bitlines and integrated process fabrication are described in U.S. Pat. Nos. 8,415,721 B2 and 8,716,138 B2. We shall not repeat the fabrication process here. The only differences between the FSNOR flash array 400 of the invention and the prior FSNOR flash array (described in U.S. Pat. Nos. 8,415,721 B2 and 8,716,138 B2) are the different mask drawings for forming the selection gates and the diffusion CS lines. FIG. 6 shows the top view of the silicon surfaces containing P-type silicon active areas, N+ sub-bitline (41 and 42) and CS line (43) diffusion areas, and the first and second field oxide areas (61, 62) for the FSNOR array. Each of the first field oxide areas 61 has straight portions 61A and bending portions 61B. The second field oxide areas 62 and the bending portions 61B are arranged in a pattern that corresponds to locations of the selection transistors 46, 48. The second field oxide areas 62 and the bending portions 61B are used to define the sectors and separate the pairs of selection transistors 46, 48 from their adjacent diffusion common source lines 43. The straight portions 61A are used to isolate adjacent sub-bit lines 41, 42 of column-adjacent NVM cell pairs.

Figure 7:
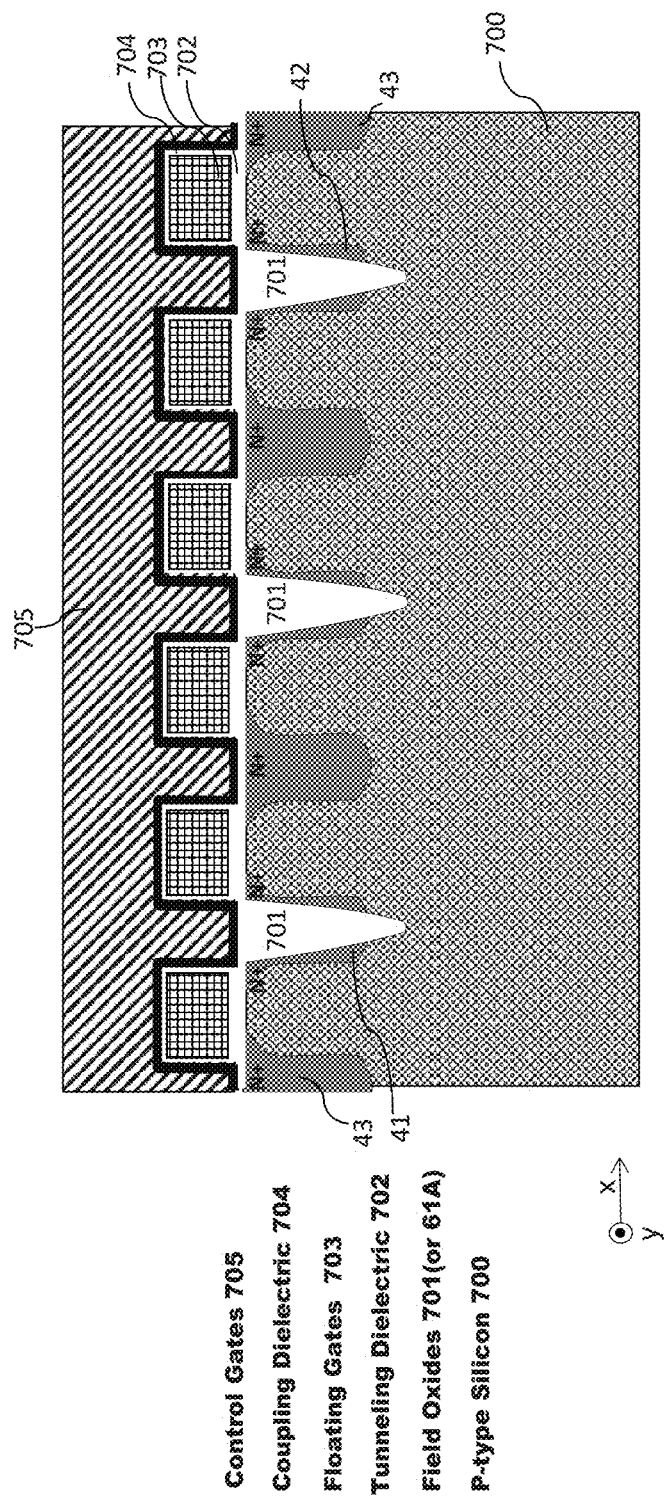
FIG. 7 shows the cross section view of the cut line "A" in FIG. 6 and assuming the charge storing material is made of conducting floating gate.

FIG. 7 shows the cross section view of the cut line "A" in FIG. 6. In the embodiment of FIG. 7, each N-type NVM cell comprises a control gate 705, a coupling dielectric 704, a floating gate 703, a tunneling dielectric 702, a source electrode (i.e., part of the CS line 43) and a drain electrode (i.e., part of N+ sub-bitline 41 or 42). The junction depth of diffusion sub-bitlines 41 and 42 are required to be above the bottom of trench isolation 701 (or field oxide areas 61, 62) such that the two sub-bitlines 41 and 42 along the two sides of trench walls are electrically isolated one from the other.

Figure 8:
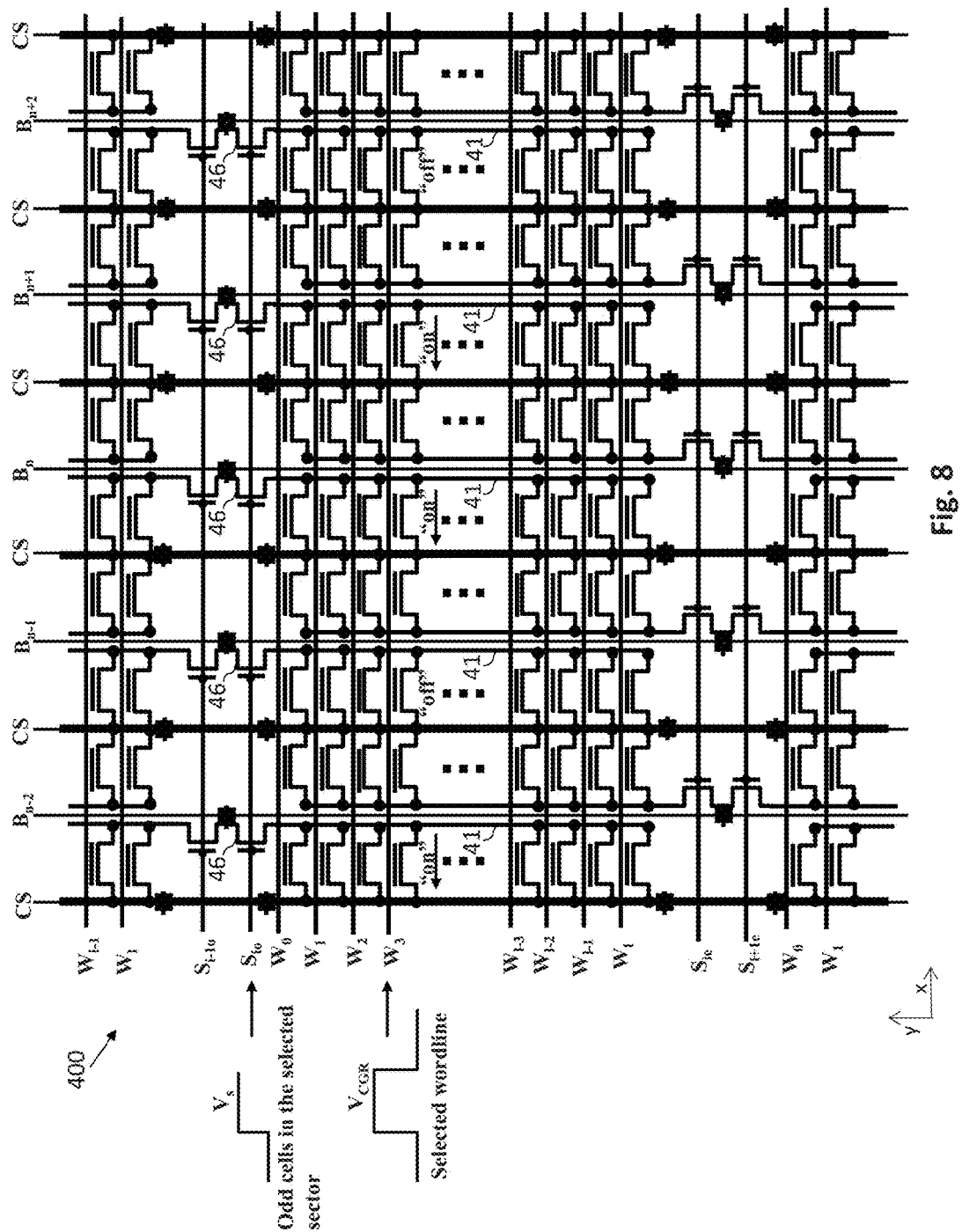
FIG. 8 shows the read operation for the odd number cell devices of a selected row in the selected sector according to the invention.
Figure 9:
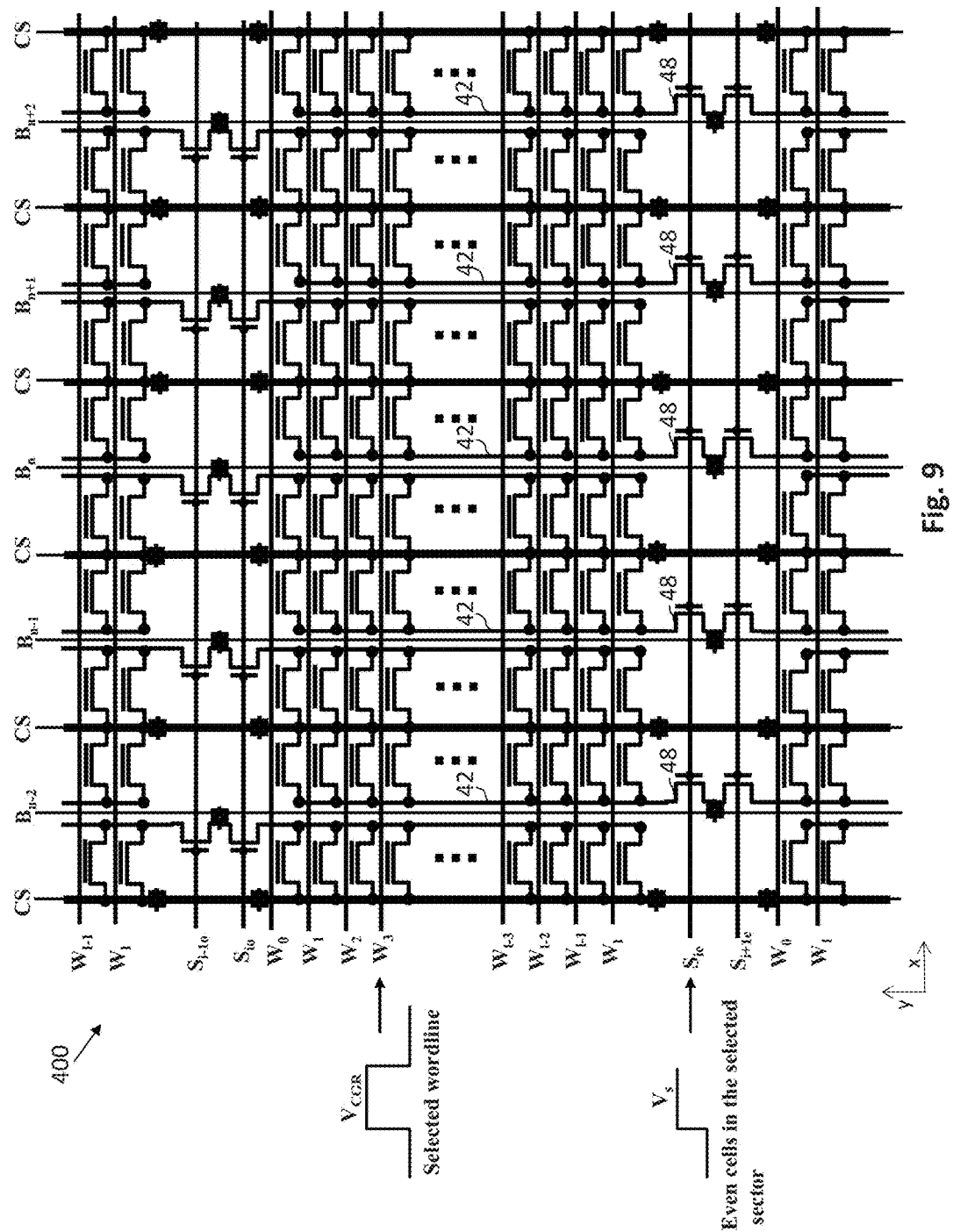
FIG. 9 shows the read operation for the even number cell devices of a selected row in the selected sector according to the invention.

In the reading mode, all the global first metal common source lines CS are electrically connected to the common ground voltage. As illustrated in FIG. 8, the odd selection line $S_{io}$ in the selected sector "i" is applied with the "on" voltage bias $V_s$ to electrically connect the odd field side sub-bitlines 41 with the global main first metal bitlines. When the control gates of the selected wordline are applied with a read voltage $V_{CGR}$, the "on/off" signals between the drain electrodes and the source electrodes of the odd number NVM cell devices passing through the "on" odd selection MOSFET devices 46 to electrically connect the odd field side sub-bitlines 41 to the main first metal bitlines $B_k$ are detected by the sensing amplifiers (not shown). The sensing amplifiers sense the voltage signals at the global main first metal bitlines. As illustrated in FIG. 9, the even selection line $S_{ie}$ in the selected sector "i" is applied with the "on" voltage bias $V_s$ to electrically connect the even field side sub-bitlines 42 with the global main first metal bitlines. When the control gates of the selected wordline are applied with a read voltage $V_{CGR}$, the "on/off" signals between the drain electrodes and the source electrodes of the even number NVM cell devices of the selected wordline passing through the "on" even selection MOSFET devices 47 to electrically connect the even field side sub-bitlines 42 to the global main first metal bitlines $B_k$, are detected by the sensing amplifiers (not shown). The sense amplifiers sense the voltage signals at the global main first metal bitlines.

Figure 10:
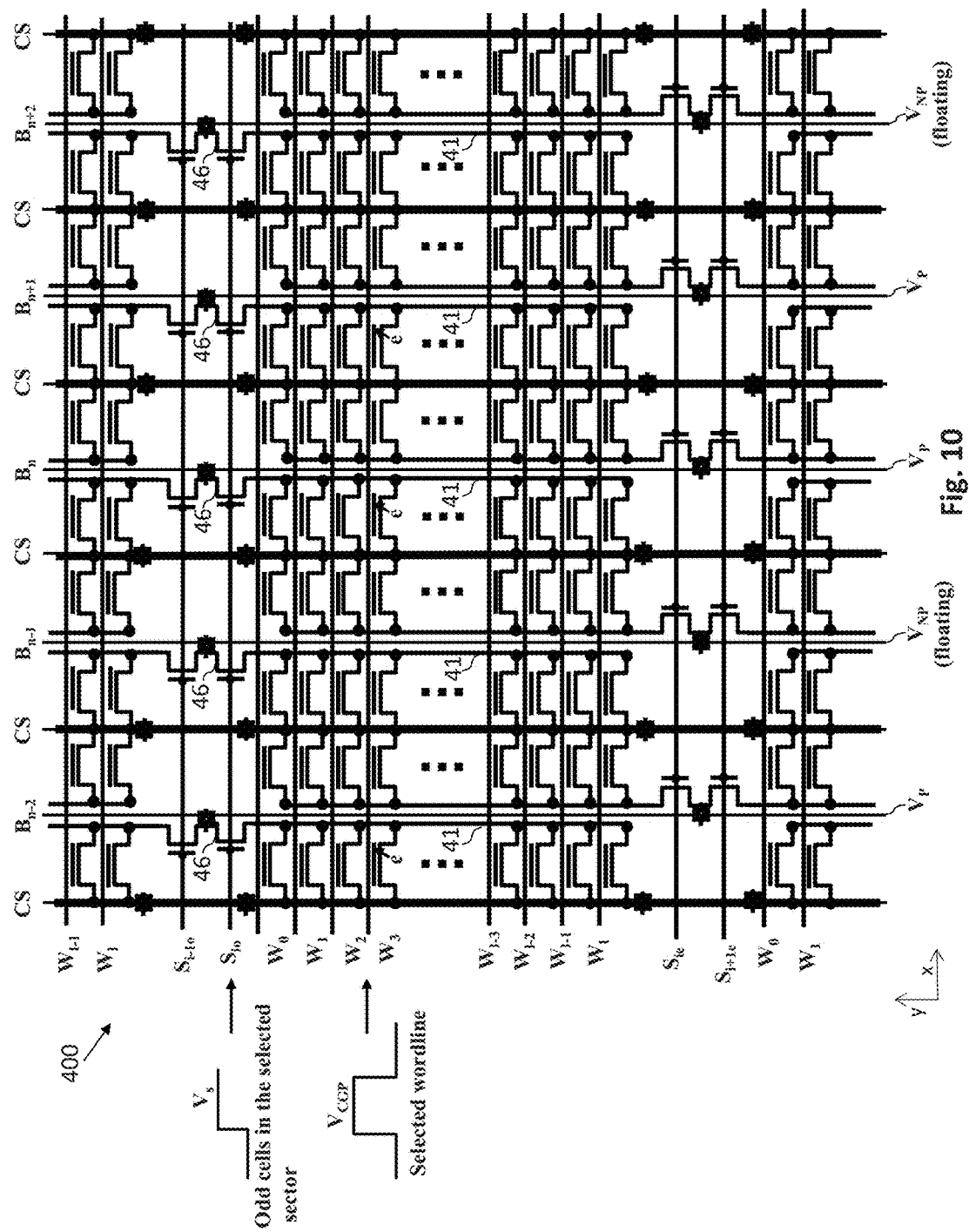
FIG. 10 shows the programming operations for the odd number cell devices of a selected row in the selected sector according to the invention.

As illustrated in FIG. 10, for programming operations, the entire global first metal common source lines CS are initially biased with the non-programming voltage $V_{NP}$ or floating. For programming the odd number NVM cell devices of the selected wordline in the sector "i", the odd selection MOSFET devices 46 are turned on by applying the "on" voltage bias $V_s$ to the odd selection line $S_{io}$ to electrically connect the odd field side sub-bitlines 41 with the main first metal lines. The programming drain voltage bias $V_P$ for the NVM cell devices to be programmed and the non-programming drain voltage $V_{NP}$ or floating for the NVM cell devices not to be programmed are applied to their corresponding global main first metal bitlines. When a control gate voltage pulse with the amplitude of $V_{CGP}$ ($>V_p$) is applied to the selected wordline, the odd number NVM cells of the selected wordline with drain voltage bias $V_p$ are programmed to the high threshold voltage state and meanwhile the odd number NVM cells of the selected wordline with the drain voltage bias $V_{NP}$ or floating remain at the low threshold voltage state accordingly. Note that the conventional Hot Carrier Injection (HCI) method for $V_{NP}$=0 V, Channel Induced Secondary Electron (CHISEL) method for $V_{NP}<V_P$ as disclosed in U.S. Pat. No. 7,733,700 B2 (the disclosure of which is incorporated herein by reference in its entirety), and Band to Band Hole Induced Secondary Electron (B2BHISEL) method for floating source node as disclosed in U.S. Pat. No. 9,082,490 B2 (the disclosure of which is incorporated herein by reference in its entirety).

Figure 11:
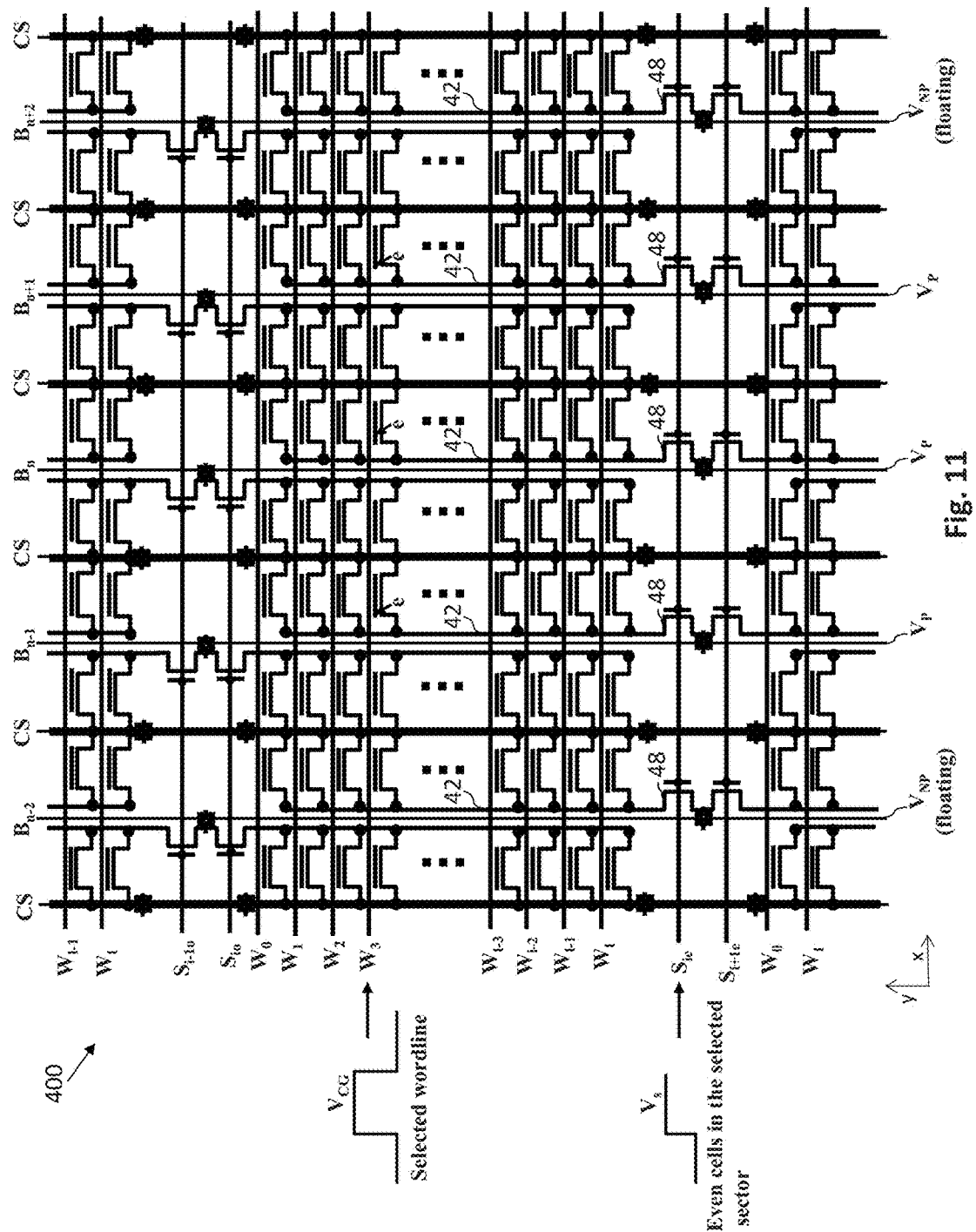
FIG. 11 shows the programming operations for the even number cell devices of a selected row in the selected sector according to the invention.

As illustrated in FIG. 11 for programming operations, the entire global first metal common source lines CS are initially biased with the non-programming voltage $V_{NP}$ or floating. For programming the even number NVM cell devices of the selected wordline in the sector "i" 400i, the even selection MOSFET devices 48 are turned on by applying the "on" voltage bias $V_s$ to the even selection line $S_{ie}$ to electrically connect the even field side sub-bitlines 42 with the global main first metal lines. The programming drain voltage bias $V_P$ for the NVM cell devices to be programmed and the non-programming drain voltage $V_{NP}$ or floating for the NVM cell devices not to be programmed are applied to their corresponding global main first metal bitlines. When a control gate voltage pulse with the amplitude of $V_{CGP}$ ($>V_p$) is applied to the selected wordline, the even number NVM cells of the selected wordline with drain voltage bias $V_p$ are programed to the high threshold voltage state and meanwhile the even number NVM cells of the selected wordline with the drain voltage bias $V_{NP}$ or floating remain at the low threshold voltage state accordingly.

To conclude the three basic flash operations, i. e., read, programming, and erase, we apply the conventional Fowler-Nordheim tunneling method for erasing a page or sector(s) as for the conventional flash erase operation. During the erase operation, the global first metal common source lines CS and the substrate are both biased with ground voltage bias or negative voltage bias, and a high control gate voltage pulse with voltage amplitude high enough to generate tunneling electrical fields between the charge storing layer and the silicon substrate (usually E~0.1 volt per angstrom oxide thickness) for the stored charges to be tunneled out is applied to the selected wordline (page erase) or wordlines (sector erase and block erase). In summary, we have disclosed the new Field Sub-bitline NOR-type (FSNOR) Non-Volatile Memory (NVM) flash array and the methods of operations for the FSNOR flash array.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A nonvolatile memory (NVM) device comprising:
a memory array of NVM cells organized in rows and columns on a substrate, each NVM cell comprising a charge storing material, a control gate, a source electrode and a drain electrode, the memory array being divided into a plurality of sectors, each sector comprising a plurality of rows of NVM cells, the NVM cells in a row being arranged in cell pairs, each cell pair sharing a common source electrode, the common source electrodes of the cell pairs in each column forming a diffusion common source line, wherein the drain electrodes of even cells of cell pairs in each column within one sector form an even sub-bit line and the drain electrodes of odd cells of cell pairs in each column within one sector form an odd sub-bit line, wherein the control gates of the NVM cells in each row form a word line;
a plurality of rows of selection transistors respectively disposed between the sectors such that two rows of selection transistors are respectively disposed on a first side and a second side of each sector and connected to the even and odd sub-bit lines within the same sector, wherein gates of the row of selection transistors on the first side form a first selection line and gates of the row of selection transistors on the second side form a second selection line, wherein each pair of row-adjacent selection transistors are connected together with a first electrical contact landed there between; and
a plurality of bit lines and a plurality of global source lines running in a column direction and disposed in alternate manner along the word line length, wherein the global source lines in a first layer are respectively connected to adjacent diffusion common source lines in a second layer through a plurality of second electrical contacts corresponding to the locations of the selection transistors, wherein the bit lines in the first layer are respectively connected to adjacent even and odd sub-bit lines in the second layer through adjacent first electrical contacts;
wherein the NVM cells in each sector array area comprise no contacts.

2. The NVM device according to claim 1, further comprising:
a plurality of first field isolations and a plurality of second field isolations running in the column direction and defining the sectors, each first field isolation having straight portions and bending portions, wherein the straight portions isolate adjacent sub-bit lines of column-adjacent cell pairs, wherein the second field isolations and the bending portions are arranged in a pattern that corresponds to locations of the selection transistors.

3. The NVM device according to claim 2, wherein each of the second field isolations and the bending portions is used to separate the pair of row-adjacent selection transistors from its adjacent diffusion common source line.

4. The NVM device according to claim 2, wherein depths of the first and the second field isolations are deeper than junction depths of the sub-bitlines.

5. The NVM device according to claim 1, wherein each of the even sub-bit line and the odd sub-bit line of cell pairs in one column within a sector has a first end and a second end, wherein the even sub-bit line and the odd sub-bit line of cell pairs in one column within the sector are terminated at different ends and respectively connected to the two rows of selection transistors respectively disposed on the first side and the second side of each sector.

6. The NVM device according to claim 1, wherein the charge storing material is made of one selected from the group consisting of conducting floating gate, charge storage dielectric film and nano-crystal grains.

7. The NVM device according to claim 1, which is a NOR-type flash memory device.

8. The NVM device according to claim 1, wherein the drain electrodes of each pair of row-adjacent selection transistors are connected together, and the source electrodes of each pair of row-adjacent selection transistors are respectively connected to two adjacent sub-bit lines of two adjacent sectors.

9. The NVM device according to claim 1, wherein the NVM cells are substantially $4F^2$ cells, where F represents the minimum feature size of a process technology node.

10. A method of reading data from a nonvolatile memory (NVM) device, the NVM device comprising a memory array of NVM cells organized in rows and columns on a substrate, a plurality of rows of selection transistors, and a plurality of bit lines and a plurality of global source lines, each NVM cell comprising a charge storing material, a control gate, a source electrode and a drain electrode, the memory array being divided into a plurality of sectors, each sector comprising a plurality of rows of NVM cells, the NVM cells in a row being arranged in cell pairs, each cell pair sharing a common source electrode, the common source electrodes of the cell pairs in each column forming a diffusion common source line, wherein the drain electrodes of even cells of cell pairs in each column within one sector form an even sub-bit line and the drain electrodes of odd cells of cell pairs in each column within one sector form an odd sub-bit line, wherein the control gates of the NVM cells in each row form a word line, the plurality of rows of selection transistors respectively disposed between the sectors such that two rows of selection transistors are respectively disposed on a first side and a second side of each sector and connected to the even and odd sub-bit lines within the same sector, wherein gates of the row of selection transistors on the first side form a first selection line and gates of the row of selection transistors on the second side form a second selection line, wherein each pair of row-adjacent selection transistors are connected together with a first electrical contact landed there between, the plurality of bit lines and the plurality of global source lines running in a column direction and disposed in alternate manner along the word line length, wherein the global source lines in a first layer are respectively connected to adjacent diffusion common source lines in a second layer through a plurality of second electrical contacts corresponding to the locations of the selection transistors, wherein the bit lines in the first layer are respectively connected to adjacent even and odd sub-bit lines in the second layer through adjacent first electrical contacts, wherein the NVM cells in each sector array area comprise no contacts, the method comprising the steps of:

applying a ground voltage to all the global source lines;

applying a voltage bias to a desired selection line to switch on corresponding selection transistors respectively connected to sub-bit lines of a selected type within a selected sector; and applying a read voltage to a selected word line to cause the NVM cells at crossings of the sub-bit lines of the selected type and the selected word line to respectively transfer electrical signals indicative of their stored data bits from the sub-bit lines of the selected type to their corresponding bit lines through the corresponding selection transistors.

11. The method according to claim 10, wherein the NVM cells are substantially $4F^2$ cells, where F represents the minimum feature size of a process technology node.

12. The method according to claim 10, wherein the NVM device further comprises:

a plurality of first field isolations and a plurality of second field isolations running in the column direction and defining the sectors, each first field isolation having straight portions and bending portions, wherein the straight portions isolate adjacent sub-bit lines of column-adjacent cell pairs, wherein the second field isolations and the bending portions are arranged in a pattern that corresponds to locations of the selection transistors.

13. A method of programming a nonvolatile memory (NVM) device, the NVM device comprising a memory array of NVM cells organized in rows and columns on a substrate, a plurality of rows of selection transistors, and a plurality of bit lines and a plurality of global source lines, each NVM cell comprising a charge storing material, a control gate, a source electrode and a drain electrode, the memory array being divided into a plurality of sectors, each sector comprising a plurality of rows of NVM cells, the NVM cells in a row being arranged in cell pairs, each cell pair sharing a common source electrode, the common source electrodes of the cell pairs in each column forming a diffusion common source line, wherein the drain electrodes of even cells of cell pairs in each column within one sector form an even sub-bit line and the drain electrodes of odd cells of cell pairs in each column within one sector form an odd sub-bit line, wherein the control gates of the NVM cells in each row form a word line, the plurality of rows of selection transistors respectively disposed between the sectors such that two rows of selection transistors are respectively disposed on a first side and a second side of each sector and connected to the even and odd sub-bit lines within the same sector, wherein gates of the row of selection transistors on the first side form a first selection line and gates of the row of selection transistors on the second side form a second selection line, wherein each pair of row-adjacent selection transistors are connected together with a first electrical contact landed there between, the plurality of bit lines and the plurality of global source lines running in a column direction and disposed in alternate manner along the word line length, wherein the global source lines in a first layer are respectively connected to adjacent diffusion common source lines in a second layer through a plurality of second electrical contacts corresponding to the locations of the selection transistors, wherein the bit lines in the first layer are respectively connected to adjacent even and odd sub-bit lines in the second layer through adjacent first electrical contacts, wherein the NVM cells in each sector array area comprise no contacts, the method comprising the steps of:

applying a first voltage bias to all the global source lines or floating all the global source lines;

applying a second voltage bias to a desired selection line to switch on corresponding selection transistors respectively connected to all sub-bit lines of a selected type within a selected sector;

applying a third voltage bias to selected bit lines respectively connected to selected sub-bit lines of the selected type; and applying a fourth voltage bias to a selected word line to cause the NVM cells at crossings of the selected sub-bit lines of the selected type and the selected word line to be programmed to a programmed threshold voltage state;

wherein the voltage level of the first voltage bias is less than that of the third voltage bias, and the voltage level of the third voltage bias is less than that of the fourth voltage bias.

14. The method according to claim 13, further comprising:

applying the first voltage bias to deselected bit lines or floating the deselected bit lines before the step of applying the fourth voltage bias, wherein the deselected bit lines are respectively connected to deselected sub-bit lines of the selected type.

15. The method according to claim 14, wherein the step of applying the fourth voltage bias further comprises:

applying the fourth voltage bias to the selected word line to cause the NVM cells at crossings of the deselected sub-bit lines of the selected type and the selected word line in the selected sector to remain at an erased threshold voltage state.

16. The method according to claim 13, further comprising:

erasing at least one row of NVM cells prior to all of the steps.

17. The method according to claim 16, wherein the step of erasing comprises:

applying a fifth voltage bias to all the global source lines and a body electrode; and applying a control gate voltage to at least one word line associated with the at least one row of NVM cells;

wherein the voltage level of the fifth voltage bias is equal to or less than a ground voltage; and wherein the control gate voltage has a voltage amplitude high enough to generate tunneling electrical fields between the charge storing material and the substrate for stored charges to be tunneled out.

* * * * *